United States Patent
Potanin et al.

(10) Patent No.: US 7,388,447 B1
(45) Date of Patent: Jun. 17, 2008

(54) INTEGRATED CLOCK GENERATOR TOLERANT TO DEVICE PARAMETER VARIATION

(75) Inventors: Vladislav Potanin, San Jose, CA (US); Elena Potanina, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 62 days.

(21) Appl. No.: 11/472,652

(22) Filed: Jun. 21, 2006

(51) Int. Cl.
*H03B 27/00* (2006.01)

(52) U.S. Cl. .................. 331/185; 331/57; 331/186

(58) Field of Classification Search .............. 331/57, 331/108 R, 108 C, 185, 186; 323/234, 265, 323/266, 267, 268, 269, 270, 273, 274; 327/535, 327/537, 538, 543
See application file for complete search history.

(56) References Cited

U.S. PATENT DOCUMENTS 5,239,274 A * 8/1993 Chi ............................ 331/57
5,748,050 A * 5/1998 Anderson .................... 331/57
6,104,254 A * 8/2000 Iravani ....................... 331/57
6,809,603 B1 * 10/2004 Ho ............................. 331/57

OTHER PUBLICATIONS

Sundaresan et al., "A 7-MHz Process, Temperature and Supply Compensated Clock Oscillator in 0.25μm CMOS" *IEEE, 2003*, pp. 1-693 to 1-696.

* cited by examiner

*Primary Examiner*—Robert J. Pascal
*Assistant Examiner*—Ryan J Johnson
(74) *Attorney, Agent, or Firm*—Merchant & Gould P.C.

(57) ABSTRACT

A method and circuit for stabilizing a frequency of a clock generator comprising a ring oscillator with respect to manufacturing process variations and a circuit temperature. A bias circuit comprising a current mirror and cascade circuits provides a compensated bias current based on a gate source voltage and drain source voltage of an output transistor, where the two voltages are independent of transistor parameters and circuit temperature. As a result, the ring oscillator frequency is stabilized with respect to those parameters.

19 Claims, 5 Drawing Sheets

BIAS CIRCUIT

INTEGRATED CLOCK GENERATOR TOLERANT TO DEVICE PARAMETER VARIATION

FIELD OF INVENTION

The present invention relates to frequency generation, and, in particular, to a clock generator circuit with a ring oscillator and a bias circuit that provides a substantially stabilized output signal with respect to a process variations and circuit temperature.

BACKGROUND

A clock generator is a circuit that produces a timing signal (known as a clock signal) for use in synchronizing a circuit's operation. Clock generators are used in most electronic devices and their implementation can range from a simple crystal oscillator to complicated circuits.

A ring oscillator, an example of a clock generator, is a device composed of a chain of stages closed in a loop whose output oscillates between two voltage levels. The output levels may represent true and false in binary logic circuits. The stages of a ring oscillator may include inverters, differential buffers, and the like, and are typically attached in a chain. The output of the last stage is fed back into the first stage. The final output signal is asserted a finite amount of time after the first input is asserted. The feedback of this last output to the input causes the oscillation.

A ring oscillator typically requires only power to operate. Above a certain threshold voltage, oscillations begin spontaneously. To increase the frequency of oscillation, the applied voltage may be increased. This increases both the frequency of the oscillation and the power consumed, which is dissipated as heat. The dissipated heat may limit a speed of a particular ring oscillator. A size of the ring oscillator may also be used to affect its frequency. A smaller ring oscillator may result in a higher frequency of oscillation for a given power consumption.

Thus, it is with respect to these considerations and others that the present invention has been made.

BRIEF DESCRIPTION OF THE DRAWINGS

Non-limiting and non-exhaustive embodiments are described with reference to the following drawings.

DETAILED DESCRIPTION

Various embodiments will be described in detail with reference to the drawings. Reference to various embodiments does not limit the scope of the invention, which is limited only by the scope of the claims attached hereto. Additionally, any examples set forth in this specification are not intended to be limiting and merely set forth some of the many possible embodiments for the claimed subject matter.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity.

Briefly stated, embodiments are related to a clock generator comprising a ring oscillator and a bias circuit, where the bias circuit is configured to provide a bias current to the ring oscillator such that frequency variations of the ring oscillator depending on manufacturing process variations and circuit temperature are substantially stabilized.

While a preferred embodiment of the present invention may be implemented with a multi-stage inverter type ring oscillator, the invention is not so limited. For example, the described bias circuit may be employed to stabilize temperature and manufacturing process dependent variation of any ring oscillator frequency. Thus, the ring oscillator portion of the clock generator circuit may be implemented in virtually any way known to those skilled in the art.

Figure 1:
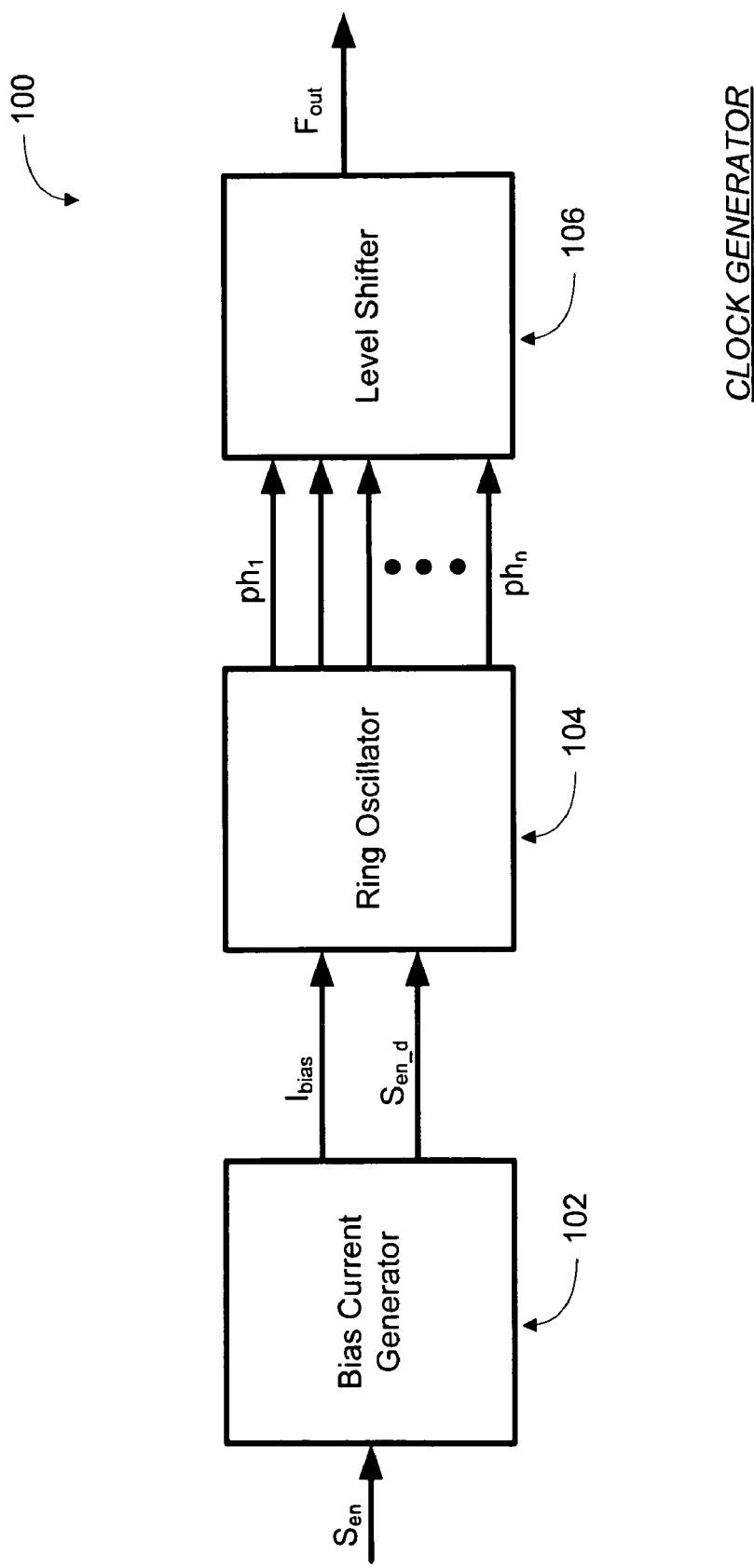
FIG. 1 illustrates a functional block diagram of a clock generator circuit according to one embodiment.

FIG. 1 illustrates a functional block diagram of a clock generator circuit according to one embodiment. Clock generator circuit 100 includes three main blocks: bias current generator 102, ring oscillator 104, and level shifter 106. Clock generator circuit 100 may be implemented in various integrated circuits (ICs) for supplying clock signal to subcircuits with a substantially fixed frequency. Tolerance of the clock frequency to device parameter variation with temperature, manufacturing fluctuations, and supply voltage is achieved by combining a compensating biasing circuit with a ring oscillator.

In many applications, such as Analog Digital Converters (ADCs), fast start-up, small die area, and low power consumption are typical design requirements. However, in order to achieve good frequency tolerance to process, temperature, and power supply variations, additional circuits may be implemented defeating the above listed design requirements. By providing a bias current that is independent of temperature and transistor parameters, bias current generator 102 of clock generator circuit 100 enables ring oscillator 104 to provide a substantially stable frequency.

Bias current generator 102 is configured to receive input enable signal $S_{en}$, which may be a digital control signal. When input enable signal $S_{en}$ is inactive all the biasing is turned off so the circuit is not consuming any power. As soon as input enable signal $S_{en}$ is changed to active (e.g. high level), bias current generator 102 turns on. Under normal conditions, it may take some time for the bias current generator 102 to reach the normal operation condition, so it generates delayed enable signal $S_{en\_d}$ that is provided to ring oscillator 104 along with bias current $I_{bias}$ allowing the oscillator to operate only when bias current reaches its nominal level.

In a preferred embodiment, the bias current generator provides a compensated bias current to ring oscillator 104. Therefore, ring oscillator 104 may be any ring oscillator known in the art that is designed to operate based on receiving a bias current. As mentioned previously, ring oscillators typically include an odd number of oscillation stages where each stage may comprise an inverter, a differential buffer, and the like. A ring oscillator operates by creating a spontaneous oscillation through a cascaded activation of the oscillation stages and a feedback of its output to its input stage.

Level shifter 106 is an optional part of clock generator 100. In some embodiments, ring oscillator 104 may provide clock signal $F_{out}$ directly to a subcircuit of the chip which includes the clock generator. In other embodiments, the effect of the circuit being provided the clock signal may distort an operation of the ring oscillator. Therefore, level shifter 106 may be used as a buffer. Level shifter 106 may receive phase signals $ph_1$ through $ph_n$, where n represents a number of oscillation stages in the ring oscillator and provide clock signal $F_{out}$ with a stable frequency.

The block diagram of clock generator circuit 100 described above is for illustration purposes only, and does not constitute a limitation on embodiments. The circuit may be implemented using fewer or additional blocks such as power supply circuits, frequency adjustment circuits, additional stabilization circuits, and the like, using the principles described herein. Furthermore, part or all of the circuits described above may be integrated. The clock signal may be provided to circuits within the same IC or in other parts of an electronic device.

Figure 2:
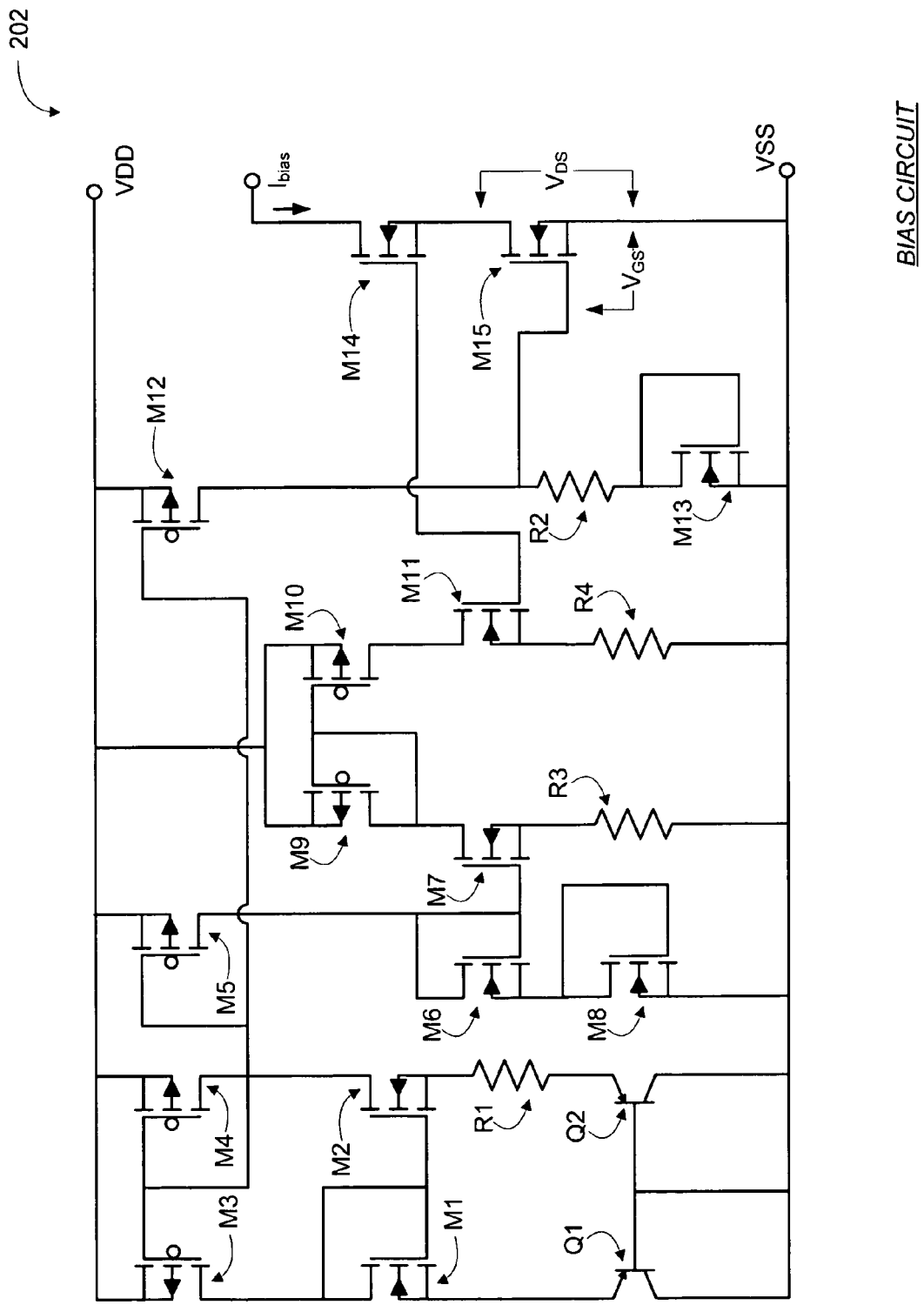
FIG. 2 schematically illustrates an embodiment of the bias circuit of the clock generator of FIG. 1.

FIG. 2 schematically illustrates an embodiment of the bias circuit of the clock generator of FIG. 1. Bias current generator 202 is configured to provide a compensated bias current ($I_{bias}$) to a ring oscillator such that frequency deviations due to process and temperature variation are substantially reduced. This is mainly accomplished by providing gate-source and drain-source bias voltages to NMOS type transistor M15 in bias current generator 202 in such a way that transistor will be in the linear operation region. M15 and its cascode partner circuit comprising transistors M14 and M11 provide the bias current $I_{bias}$ to the ring oscillator.

A drain current of M15 can be evaluated as:

$$I_D = \mu_n * C_{ox} * \frac{W}{L} * (V_{GS} - V_{th}) * V_{DS}, \tag{1}$$

where $\mu n$ is a mobility of electrons, $C_{ox}$ is a gate capacitance, W and L are effective gate width and length, $V_{th}$ is an NMOS transistor threshold voltage, $V_{GS}$ and $V_{DS}$ are gate and drain voltages.

Gate-source and drain-source voltages that are generated by the rest of the circuit can be expressed as:

$$V_{GS} = V_{th} + \Delta V_{be}, \text{ and} \tag{2}$$

$$V_{DS} = \alpha * V_{th}, \tag{3}$$

where $\alpha$ is a constant and $\Delta V_{be}$ is a specially generated voltage.

Considering first-order effects, an oscillation frequency of a multi-stage ring oscillator can be expressed as:

$$F = \frac{1}{N * T_d} = \frac{I_{bias}}{N * C * V_t}. \tag{4}$$

This relationship is discussed in more detail below in conjunction with FIG. 3. However, using (1), (2), and (3), the oscillator frequency F in equation (4) can be conveyed as:

$$F = \frac{\mu_n * C_{ox} * \frac{W}{L} * \Delta V_{be} * \alpha}{N * C}. \tag{5}$$

As can be seen from equation (5), there are only two temperature dependent components, $\mu_n$ and $\Delta V_{be}$. $C_{ox}$ and C have typically very low temperature coefficients and W, L, N, and $\alpha$ are constants. By generating $\Delta V_{be}$ with a temperature coefficient substantially equal and opposite to the temperature coefficient of electron mobility, the first order temperature drift of oscillation frequency can be compensated.

Moreover, a variation of the device specific parameters due to manufacturing process imperfections may be also partially compensated because most of the load capacitance C in the denominator is a gate capacitance of a next stage, which is proportional to $C_{ox}$ in the nominator.

In bias current generator 202, where the voltages $V_{GS}$ and $V_{DS}$ respectively bias a gate and a drain of M15, the gate voltage $V_{GS}$ is a sum of a voltage drop across transistor M13 and resistor R2. The voltage across M13 approximately equals to NMOS threshold voltage $V_{th}$, while a voltage drop across R2 can be expressed as:

$$V_{R2} = \Delta V_{be} * \frac{R2}{R1}, \text{ where} \tag{6}$$

$$\Delta V_{be} = \frac{kT}{q} * \ln\left(\frac{A_{E1}}{A_{E2}}\right) \tag{7}$$

is a difference of base-emitter voltages of transistors Q1 and Q2 with $A_{E1}$ and $A_{E2}$ being respective emitter areas of the junction transistors. To obtain non-zero voltage difference the emitter area of transistor Q2 typically needs to be larger than the emitter area of Q1. Thus, the temperature coefficient of the $\Delta V_{be}$ can be adjusted to a desired value by selecting an emitter area ratio of Q2 and Q1.

Drain voltage of transistor M15 is maintained by the cascode circuit comprising transistors M14 and M11 at a level determined by the voltage drop across R4. This voltage approximately equals to:

$$V_{R4} = V_{th} * \frac{R4}{R3}. \tag{8}$$

Considering equations (6) and (8) and denoting $$\alpha = \frac{R2}{R1} * \frac{R4}{R3}, \tag{9}$$

it can be concluded that bias current generator 202 generates compensated bias current whose oscillation frequency can be evaluated by equation (5).

In addition to the above described components of bias current generator 202, transistor pairs M3-M4, M3-M5, and M3-M12 are current sources enabling an operation of the above described components. Similarly, M9-M10 transistor pair provides current to M11 and M7.

Embodiments of the present disclosure are not limited to the above described circuit. Other configurations with additional or fewer components may be implemented using the principles described herein.

Figure 3:
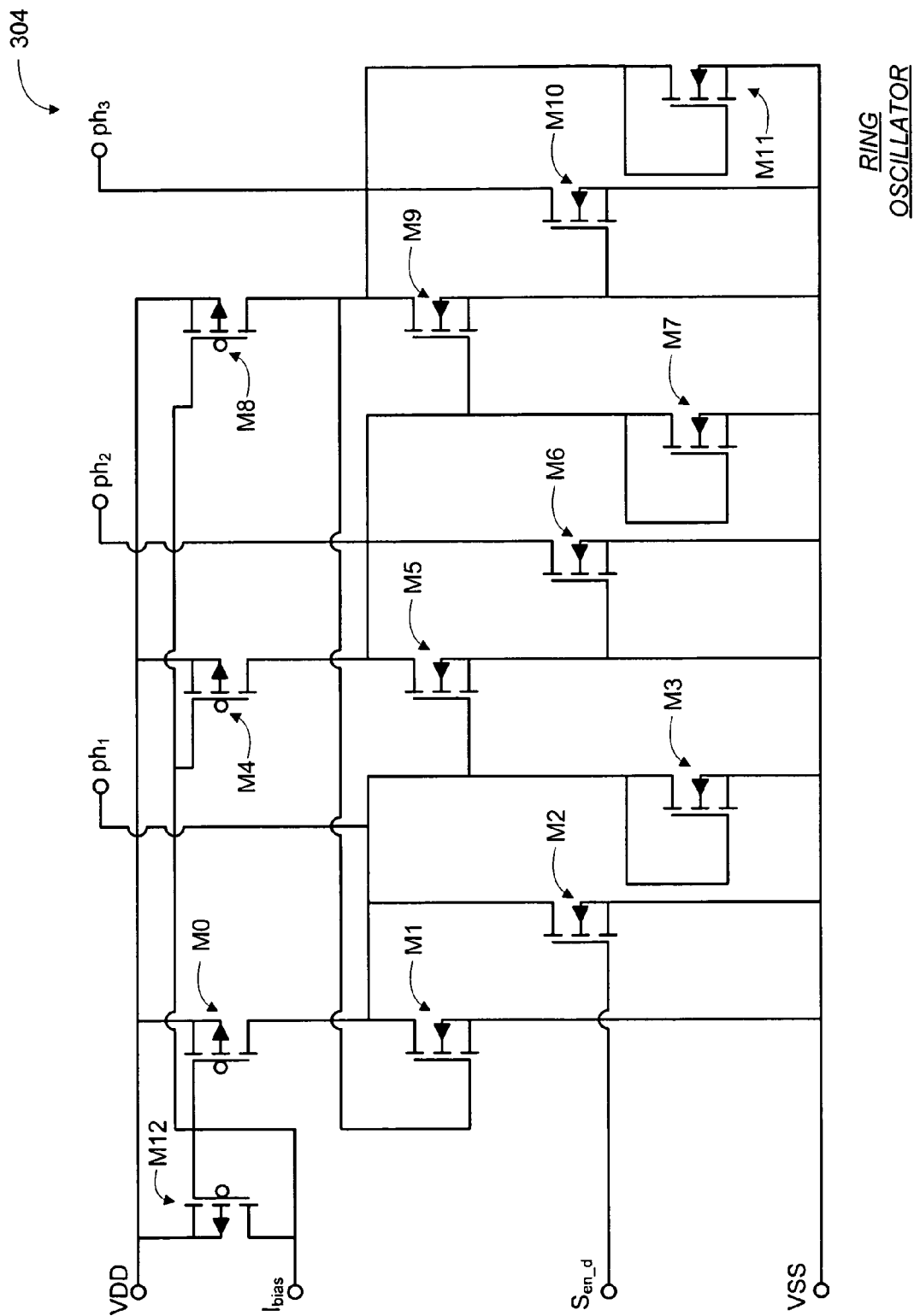
FIG. 3 schematically illustrates an example implementation of the ring oscillator circuit of the clock generator of FIG. 1.

FIG. 3 schematically illustrates an example implementation of the ring oscillator circuit of the clock generator of FIG. 1. Ring oscillator 304 is implemented using single-ended, current and voltage limited buffers. The example implementation includes three buffer stages, where each stage includes a current source, two switching elements, and a limiting element. Transistor pairs M12-M0, M12-M4, and M12-M8 are the current sources for each buffer stage. Transistors M1-M2, M5-M6, and M9-M10 are respective switching pairs for each stage. Finally, transistors M3, M7, and M11 are diode connected limiting transistors for each stage, which clamp source voltages of M1, M5, and M9, respectively.

In an operation, ring oscillator 304 receives delayed enable signal $S_{en\_d}$ indicating an inactive status (e.g. high) from the bias current generator. Current source transistors (M0, M4, M8, M12) are properly biased and signals $ph_1$ and $ph_3$ settle at a low level determined by an ON-resistance of transistors M2 and M9, while signal $ph_2$ reaches a relatively high level limited by a voltage drop across diode connected transistor M7.

As soon as $S_{en\_d}$ changes to low indicating an active status transistor M2 turns off, and signal $ph_1$ is charged by current source M0 with its associated parasitic capacitance, such that after a certain delay $ph_1$ reaches a level that turns on switching transistor of the next stage (M5). Thus, $ph_2$ drops to its low level determined by ON-resistance of the transistor M5. Last event switches off transistor M9 in the third stage such that $ph_3$ gradually increases until transistor M1 in the first stage turns on pulling down $ph_1$ again. As long as delayed enable signal $S_{en\_d}$ remains low indicating the active status, the described sequence of events repeat continuously generating a low amplitude oscillation.

Oscillation frequency in the ring oscillator is determined by a signal delay in the buffer stage, which in its turn depends substantially on the bias current $I_{bias}$ and a parasitic capacitance associated with the buffer output. As mentioned above, the oscillation frequency can be expressed as illustrated in equation (4). In equation (4), $I_{bias}$ is bias current, N is number of stages, C is total capacitance in the output node, and $V_t$ is buffer threshold voltage. As equation (4) indicates, oscillation frequency depends on C and $V_t$ with an ideally constant bias current. CMOS processes may provide a gate oxide and p-n junction capacitance variation substantially within ±10% over process and temperature. $V_t$, which is practically equal to NMOS threshold voltage may have an about ±10% process variation and an about 30% temperature drift within commercial operation temperature range. As much as C and $V_t$ vary with process and temperature, so does the frequency.

Thus, the principle of compensation for the device parameters variation lays in the method for generating bias current described previously in conjunction with FIG. 2.

The example implementation of ring oscillator 304 in FIG. 3 is for illustration purposes only. Ring oscillators are known in the art and different types of ring oscillators with any number of stages may be used in conjunction with the compensating bias current generator circuit according to embodiments. Furthermore, the transistors shown in ring oscillator 304 are PMOS and NMOS type. However, implementations are not limited to MOSFET type transistors, and other types may be used without departing from a scope and spirit of the embodiments.

Figure 4:
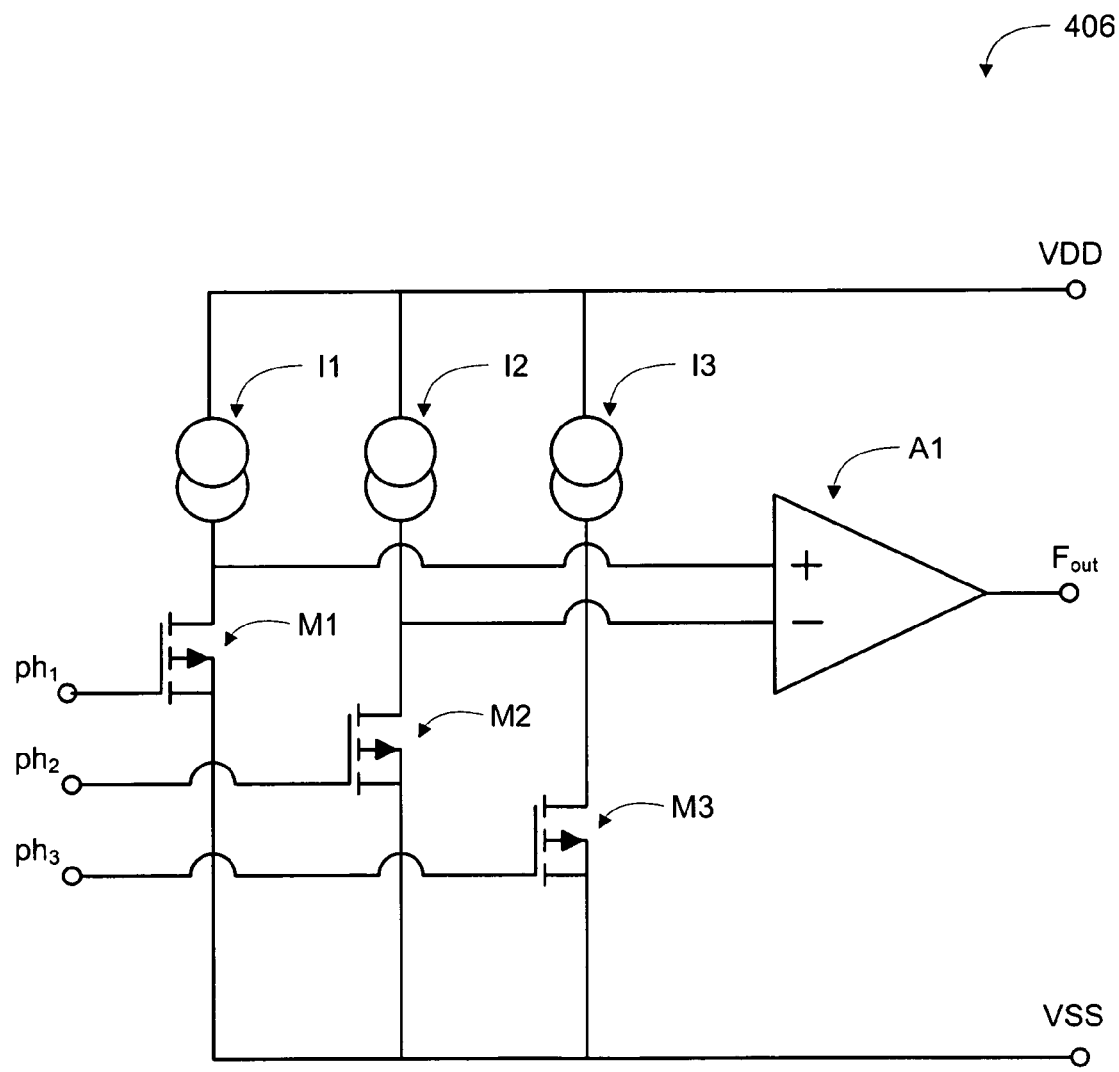
FIG. 4 schematically illustrates an example implementation of the level shifter circuit of the clock generator of FIG. 1.

FIG. 4 schematically illustrates an example implementation of the level shifter circuit of the clock generator of FIG. 1. In a typical implementation, the amplitude of the oscillation signal from the ring oscillator is relatively low. However, a clock signal for digital CMOS logic needs to be rail-to-rail. Level shifter 406 may be used to expand a low-amplitude internal oscillation.

To implement the amplification, a fast comparator A1 may be used receiving signals from two tabs of the ring oscillator (e.g. $ph_1$ and $ph_2$). Because an input capacitance of the comparator A1 may result in an unequal distribution of load capacitance among the ring oscillator's outputs, transistors M1, M2, and M3 may be used as identical drain followers providing equal load to all three ring oscillator signals. Current sources I1, I2, and I3 provide source current to the drain followers.

Level shifter 406 is one example method of amplifying the ring oscillator output. Other circuits may be used to amplify the outputs, or in some embodiments, where signal level is not of concern, the outputs may be provided directly to the subcircuit.

Embodiments additionally methods of operation. A method of operation may be generally defined as a group of steps or operations leading to a desired result, due to the nature of the elements in the steps and their sequence. The methods are usually advantageously implemented as a sequence of steps or operations for a processor or programmable device, such as the structures described above.

Performing the steps, instructions, or operations of the methods requires manipulation of physical quantities. Usually, though not necessarily, these quantities may be transferred, combined, compared, and otherwise manipulated or processed according to the steps or instructions. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as signals, voltages, currents, bits, values, symbols, or the like. It should be borne in mind, however, that all of these and similar terms are associated with the appropriate physical quantities, and that these terms are merely convenient labels applied to these physical quantities, individually or in groups.

This detailed description is presented largely in terms of schematic diagrams, flowcharts, algorithms, and symbolic representations of operations. Indeed, such descriptions and representations are the type of convenient labels used by those skilled in programming and/or the data processing arts to effectively convey the substance of their work to others skilled in the art. A person skilled in the art of electronic circuits may use these descriptions to readily generate specific circuits, devices, and methods for implementing the embodiments.

As mentioned above, the claimed subject matter also includes methods. Some are methods of operation of a clock generator or subcircuits thereof. These methods can be implemented in any number of ways, including the structures described in this document. One such way is by machine operations, of devices of the type described in this document. Another optional way is for one or more of the individual operations of the methods to be performed by distinct components or subcircuits of a circuit.

Methods are now described more particularly according to embodiments.

Figure 5:
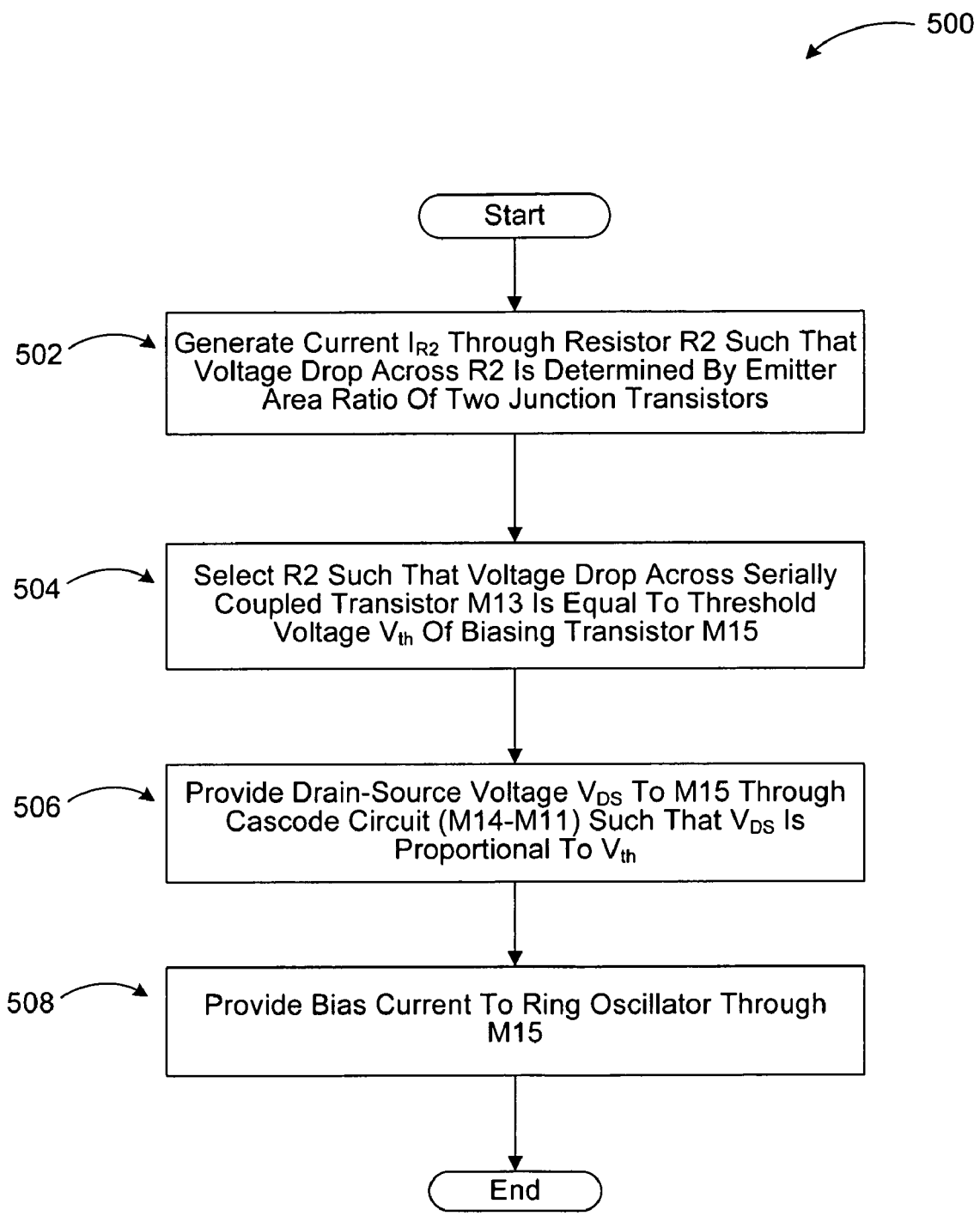
FIG. 5 is flow chart of a process for compensating a ring oscillator for process variations and circuit temperature according to an embodiment.

FIG. 5 is flow chart of a process for compensating a ring oscillator for process variations and circuit temperature according to an embodiment. The method of flowchart 500 may be implemented in a clock generator circuit such as clock generator 100 of FIG. 1. In the description of the operations of process 500 below certain references are made to circuits and components. The reference numerals used below refer to components of the bias current generator 202 of FIG. 2.

According to an operation 502, a current is provided through a resistor (R2) which is coupled to a gate of a biasing transistor (M15). The current is controlled by a pair of junction transistors such that the voltage drop across the resistor is proportional to a ratio of emitter areas of the two junction transistors (Q1, Q2).

According to a next operation 504, the resistor (along with three other resistors in parallel configuration to R2 in the bias current generator circuit) is selected such that a voltage drop across a transistor that is serially coupled between the resistor (R2) and a low supply voltage is substantially equal to a threshold voltage of the biasing transistor (M15).

As a result of operations 502 and 504, a gate source voltage $V_{GS}$ of the biasing transistor (M15) is set to a sum of two voltages, which are dependent on the emitter area ratios of the junction transistors and ratios of the four selected resistors in the circuit. Thus, the gate source voltage is dependent on transistor parameters and circuit temperature in a way, desired for compensation.

According to a next operation 506, a drain source voltage $V_{DS}$ is provided to the biasing transistor through its cascode circuit comprising transistor pair M14 and M11. The cascode pair is configured to provide $V_{DS}$ based on a voltage drop across another resistor (R4) such that $V_{DS}$ is proportional to the threshold voltage.

As a result of being provided the gate source voltage and the drain source voltage as described above, biasing transistor M15 provide bias current $I_{bias}$ to a ring oscillator in operation 508, where the bias current is substantially depends of circuit temperature and device parameters in a way, desired for compensation.

In the above, the order of operations is not constrained to what is shown, and different orders may be possible. In addition, actions within each operation can be modified, deleted, or new ones added without departing from the scope and spirit of the claimed subject matter. Plus other, optional operations and actions can be implemented with these methods, as will be inferred from the earlier description.

In this description, numerous details have been set forth in order to provide a thorough understanding. In other instances, well-known features have not been described in detail in order to not obscure unnecessarily the description.

A person skilled in the art will be able to practice the embodiments in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and sub-combinations of elements, features, steps, and/or functions, which are regarded as novel and non-obvious. Additional claims for other combinations and sub-combinations may be presented in this or a related document.

What is claimed is:

1. A circuit for providing a stabilized bias current to a ring oscillator, comprising:
    a biasing transistor configured to provide the stabilized bias current, wherein the biasing transistor is provided a gate source voltage VGS such that VGS=Vth+ΔVbe, and a drain source voltage VDS that is proportional to a threshold voltage Vth such that VDS=α*Vth, α being a constant;
    a cascode circuit comprising a gate-coupled transistor pair, wherein one transistor is coupled to a drain of the biasing transistor and is configured to provide VDS;
    a serially coupled second resistor and a diode connected first transistor configured to provide VGS, wherein the diode connected first transistor is arranged to provide Vth and a voltage across the second resistor is proportional to ΔVbe, and wherein ΔVbe is proportional to a ratio of emitter areas of two junction transistors
    a pair of base-coupled junction transistors; and
    a first resistor coupled to an emitter of one of the base-coupled junction transistor pair, wherein the base-coupled junction transistor pair is configured to provide a base emitter voltage to the second resistor such that the voltage across the second resistor is ΔVbe times a ratio of a resistance of the second transistor to a resistance of the first transistor, and wherein ΔVbe is proportional to a natural logarithm of the ratio of emitter areas of the base-coupled pair of junction transistors.

2. The circuit of claim 1, wherein a junction area of the junction transistor coupled to the first resistor is larger than a junction area of the other junction transistor of the base-coupled junction transistor pair.

3. The circuit of claim 1, wherein the first resistor and the second resistor are coupled through a set of current mirror transistor pairs.

4. The circuit of claim 1, further comprising:
    a diode connected second transistor configured to generate and provide Vth through a current mirror transistor pair to a third resistor; and
    a fourth resistor coupled between a source of another transistor of the cascode circuit and a low supply voltage line, wherein the other transistor of the cascode circuit and the fourth resistor are coupled to the third resistor through a current mirror transistor pair.

5. The circuit of claim 4, wherein α is a ratio of the resistance of the second resistor times a resistance of the fourth resistor to the resistance of the first resistor times a resistance of the third resistor.

6. The circuit of claim 4, wherein a frequency F of the ring oscillator with N oscillation stages is expressed as:

$$F = \frac{\mu * Cox * \frac{W}{L} * \Delta Vbe * \alpha}{N * C},$$

wherein μ is an electron mobility coefficient, Cox a gate capacitance, W and L respective gate width and length for the biasing transistor, and C a total capacitance of the ring oscillator.

7. The circuit of claim 4, wherein a temperature coefficient of μ and a temperature coefficient of ΔVbe are about equal and opposite such that a temperature dependent increase in μ is compensated by a temperature dependent decrease in ΔVbe.

8. The circuit of claim 4, wherein the current mirror transistor pairs are PMOS FETs.

9. The circuit of claim 1, wherein the ring oscillator includes at least one stage comprising an inverter circuit.

10. The circuit of claim 1, wherein the ring oscillator includes at least one stage comprising a differential buffer circuit.

11. The circuit of claim 1, wherein the biasing transistor and the transistor pair of the cascode circuit are MOSFETs.

12. A method for providing a stabilized bias current to a ring oscillator, comprising:
in response to receiving an enable signal, generating a first voltage ΔVbe employing two gate-coupled junction transistors such that ΔVbe is based on a ratio of emitter areas of the two junction transistors;
providing the first voltage through a first resistor to a second resistor such that a second voltage across the second resistor is about ΔVbe times a ratio of a resistance of the second resistor to a resistance of the first resistor;
generating a threshold voltage Vth across a diode connected first transistor; and
providing a sum of the second voltage and the threshold voltage to a biasing transistor as gate source voltage.

13. The method of claim 12, further comprising:
generating the threshold voltage across a diode connected second transistor;
providing a third voltage based on the threshold voltage to a first transistor of a gate-coupled transistor pair that is configured to operate as a cascode circuit to the biasing transistor through a third resistor and a fourth resistor, wherein the third resistor and the fourth resistor are coupled through two sets of current mirror transistor pairs; and
providing a drain source voltage from a second transistor of the cascode circuit to the biasing transistor based on the third voltage, wherein the drain source voltage is the threshold voltage times a constant α.

14. The method of claim 13, wherein α is a ratio of the resistance of the second resistor times a resistance of the fourth resistor to the resistance of the first resistor times a resistance of the third resistor.

15. The method of claim 14, further comprising:
providing the stabilized bias current from the biasing transistor and the second transistor of the cascode circuit to the ring oscillator, wherein the bias current is substantially independent of a device parameter and a circuit temperature.

16. The method of claim 15, wherein a frequency of a signal generated by the ring oscillator is proportional to a ratio of a gate capacitance of the biasing transistor to a total capacitance of the ring oscillator substantially cancelling an effect of the device parameter due to manufacturing process variations.

17. The method of claim 14, further comprising:
employing NMOS FET transistors for the biasing transistor, the cascode circuit, and the diode connected first and second transistors.

18. A circuit for providing a compensated bias current to a ring oscillator, comprising:
a means for generating a first voltage ΔVbe employing two gate-coupled junction transistors such that ΔVbe is based on a ratio of emitter areas of the two junction transistors, in response to receiving an enable signal;
a means for providing the first voltage through a first resistor to a second resistor such that a second voltage across the second resistor is about ΔVbe times a ratio of a resistance of the second resistor to a resistance of the first resistor;
a means for generating a threshold voltage Vth across a diode connected first transistor;
a means for providing a sum of the second voltage and the threshold voltage to a biasing transistor as gate source voltage;
a means for generating the threshold voltage across a diode connected second transistor;
a means for providing a third voltage based on the threshold voltage to a first transistor of a gate-coupled transistor pair that is configured to operate as a cascode circuit to the biasing transistor through a third resistor and a fourth resistor, wherein the third resistor and the fourth resistor are coupled through two sets of current mirror transistor pairs; and
a means for providing a drain source voltage from a second transistor of the cascode circuit to the biasing transistor based on the third voltage, wherein the drain source voltage is the threshold voltage times a constant α, and wherein α is a ratio of the resistance of the second resistor times a resistance of the fourth resistor to the resistance of the first resistor times a resistance of the third resistor.

19. The circuit of claim 18, further comprising:
a means for providing the stabilized bias current from the biasing transistor and the second transistor of the cascode circuit to the ring oscillator, wherein the bias current is substantially independent of a device parameter and a circuit temperature.

* * * * *

UNITED STATES PATENT AND TRADEMARK OFFICE
CERTIFICATE OF CORRECTION

| | |
|---|---|
| PATENT NO. | : 7,388,447 B1 |
| APPLICATION NO. | : 11/472652 |
| DATED | : June 17, 2008 |
| INVENTOR(S) | : Vladislav Potanin et al. |

It is certified that error appears in the above-identified patent and that said Letters Patent is hereby corrected as shown below:

Column 3, Line 53: "where µn is a mobility" should read -- where $\mu_n$ is a mobility --

Column 4, Line 18: "and $\Delta V_{be}.C_{ox}$" should read -- and $\Delta V_{be}. C_{ox}$ --

Column 8, Line 21: "two junction transistors" should read -- two junction transistors; --

Signed and Sealed this

Seventeenth Day of March, 2009

JOHN DOLL
*Acting Director of the United States Patent and Trademark Office*